(12) United States Patent
Hirler

(10) Patent No.: US 9,768,291 B2
(45) Date of Patent: Sep. 19, 2017

(54) SEMICONDUCTOR DEVICE HAVING A NON-DEPLETABLE DOPING REGION

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/196,838

(22) Filed: Jun. 29, 2016

(65) Prior Publication Data
US 2017/0005192 A1    Jan. 5, 2017

(30) Foreign Application Priority Data
Jun. 30, 2015   (DE) .................. 10 2015 110 484

(51) Int. Cl.
*H01L 29/78*        (2006.01)
*H01L 29/06*        (2006.01)
(Continued)

(52) U.S. Cl.
CPC ........ *H01L 29/7811* (2013.01); *H01L 21/266* (2013.01); *H01L 29/0634* (2013.01);
(Continued)

(58) Field of Classification Search
CPC ............. H01L 29/7811; H01L 29/0634; H01L 29/0696; H01L 29/1095; H01L 29/36;
(Continued)

(56) References Cited

U.S. PATENT DOCUMENTS

| | | | |
|---|---|---|---|
| 6,512,268 B1 * | 1/2003 | Ueno .................. | H01L 29/0634 257/341 |
| 6,768,169 B2 * | 7/2004 | Tihanyi ............... | H01L 29/0634 257/339 |

(Continued)

FOREIGN PATENT DOCUMENTS

| | | |
|---|---|---|
| DE | 102015107456 A1 | 11/2015 |
| JP | 2007221024 A | 8/2007 |

(Continued)

*Primary Examiner* — Ida M Soward
(74) *Attorney, Agent, or Firm* — Murphy, Bilak & Homiller, PLLC

(57) ABSTRACT

A semiconductor device includes a plurality of compensation regions of a vertical electrical element arrangement, a plurality of drift regions of the vertical electrical element arrangement and a non-depletable doping region. The compensation regions of the plurality of compensation regions are arranged in a semiconductor substrate of the semiconductor device. Further, the plurality of drift regions of the vertical electrical element arrangement are arranged in the semiconductor substrate within a cell region of the semiconductor device. The plurality of drift regions and the plurality of compensation regions are arranged alternatingly in a lateral direction. The non-depletable doping region extends laterally from an edge of the cell region towards an edge of the semiconductor substrate. The non-depletable doping region has a doping non-depletable by voltages applied to the semiconductor device during blocking operation.

19 Claims, 8 Drawing Sheets

(51) Int. Cl.
*H01L 29/10* (2006.01)
*H01L 29/36* (2006.01)
*H01L 29/40* (2006.01)
*H01L 29/66* (2006.01)
*H01L 29/73* (2006.01)
*H01L 29/739* (2006.01)
*H01L 21/266* (2006.01)

(52) U.S. Cl.
CPC .......... *H01L 29/1095* (2013.01); *H01L 29/36* (2013.01); *H01L 29/402* (2013.01); *H01L 29/66333* (2013.01); *H01L 29/66712* (2013.01); *H01L 29/7395* (2013.01); *H01L 29/0619* (2013.01); *H01L 29/7398* (2013.01)

(58) Field of Classification Search
CPC ............. H01L 29/402; H01L 29/66333; H01L 29/66712; H01L 29/7395
See application file for complete search history.

(56) References Cited

U.S. PATENT DOCUMENTS

| | | | |
|---|---|---|---|
| 7,880,260 B2 | 2/2011 | Falck et al. | |
| 8,546,875 B1* | 10/2013 | Hirler | H01L 23/481 257/330 |
| 9,209,292 B2* | 12/2015 | Schulze | H01L 29/7823 |
| 9,281,392 B2* | 3/2016 | Weyers | H01L 29/0634 |
| 9,450,062 B2* | 9/2016 | Hutzler | H01L 29/66333 |
| 2005/0098826 A1* | 5/2005 | Yamaguchi | H01L 29/0634 257/341 |
| 2006/0157813 A1 | 7/2006 | Saito et al. | |
| 2006/0208334 A1 | 9/2006 | Yamauchi et al. | |
| 2009/0206440 A1 | 8/2009 | Schulze et al. | |
| 2015/0187874 A1* | 7/2015 | Hirler | H01L 21/266 257/139 |
| 2015/0263165 A1* | 9/2015 | Finney | H01L 29/66681 257/339 |
| 2015/0333168 A1 | 11/2015 | Hirler et al. | |
| 2015/0333169 A1* | 11/2015 | Willmeroth | H02M 1/08 257/329 |

FOREIGN PATENT DOCUMENTS

| | | |
|---|---|---|
| JP | 2008103529 A | 5/2008 |
| JP | 2012156151 A | 8/2012 |
| WO | 2012131878 A1 | 10/2012 |
| WO | 2014162969 A1 | 10/2014 |

* cited by examiner

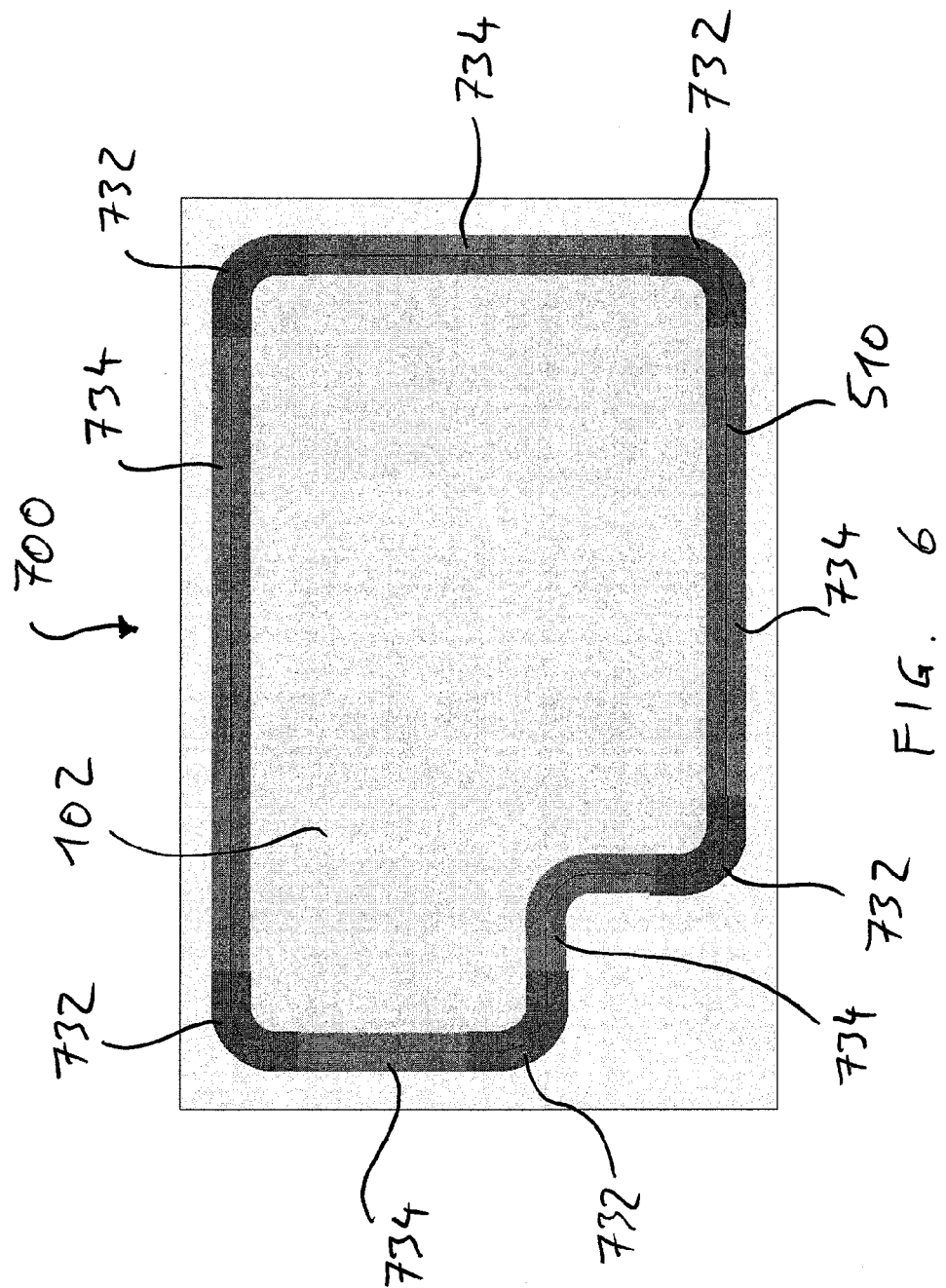

SEMICONDUCTOR DEVICE HAVING A NON-DEPLETABLE DOPING REGION

PRIORITY CLAIM

This application claims priority to German Patent Application No. 10 2015 110 484.9 filed on 30 Jun. 2015, the content of said application incorporated herein by reference in its entirety.

TECHNICAL FIELD

Embodiments relate to concepts for edge termination structures for semiconductor devices and in particular to semiconductor devices and methods for forming semiconductor devices.

BACKGROUND

In many applications, power transistors are operated in the reverse mode (e.g. half bridge arrangements). In this connection, the body diode may be turned into the forward operation and the p-body region as well as the n-substrate (at an n-channel MOS, metal oxide semiconductor) inject electrons and holes as plasma into the drift zone. A lot of the plasma may be stored especially at the edge region due to the high volume, which is to be depleted during applying a blocking voltage (commutating). All holes from the edge region have to flow off through the outermost source/body contact, while the electrons can flow off to the provided large-area substrate, for example. Consequently, very high hole current densities and high hole concentrations may be reached at the edge region. It is desired to increase the reliability and/or durability of semiconductor devices.

There may be a demand for providing a concept for semiconductor devices which provide increased reliability and/or durability.

SUMMARY

Some embodiments relate to a semiconductor device comprising a plurality of compensation regions of a vertical electrical element arrangement, a plurality of drift regions of the vertical electrical element arrangement and a non-depletable doping region. The compensation regions of the plurality of compensation regions are arranged in a semiconductor substrate of the semiconductor device. Further, the plurality of drift regions of the vertical electrical element arrangement is arranged in the semiconductor substrate within a cell region of the semiconductor device. The plurality of drift regions and the plurality of compensation regions are arranged alternatingly in a lateral direction. The non-depletable doping region extends laterally from an edge of the cell region towards an edge of the semiconductor substrate. The non-depletable doping region comprises a doping non-depletable by voltages applied to the semiconductor device during blocking operation. Further, the plurality of compensation regions and the non-depletable doping region comprise a first conductivity type and the plurality of drift regions comprises a second conductivity type. The non-depletable doping region comprises a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a drift zone or a compensation region of the plurality of compensation regions to a closest contact area between the semiconductor substrate and an electrically conductive contact structure of the vertical electrical element arrangement within the cell region or at a position located closer to an edge of the semiconductor substrate than a gate field plate implemented by a lowest electrically conductive layer.

Some embodiments relate to a semiconductor device comprising a vertical electrical element arrangement and a non-depletable doping region. The vertical electrical element arrangement enables a current flow between a front side and a back side of a semiconductor substrate of the semiconductor device. Further, the non-depletable doping region extends laterally from an edge of a cell region of the semiconductor substrate towards an edge of the semiconductor substrate. The non-depletable doping region comprises a doping non-depletable by voltages applied to the semiconductor device during blocking operation. The non-depletable doping region comprises a first conductivity type. The non-depletable doping region comprises a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a compensation region of the plurality of compensation regions to a closest contact area between the semiconductor substrate and an electrically conductive contact structure of the vertical electrical element arrangement within the cell region or at a position located closer to an edge of the semiconductor substrate than a gate field plate implemented by a lowest electrically conductive layer. Further, a lateral distance between a part of the non-depletable doping region comprising the lower doping concentration and a doping region of the semiconductor substrate comprising the second conductivity type and located outside the cell region is lower than 20 µm.

Some embodiments relate to a method for forming a semiconductor device. The method comprises forming a plurality of compensation regions of a vertical electrical element arrangement. The compensation regions of the plurality of compensation regions extend into a semiconductor substrate of the semiconductor device. Further, a plurality of drift regions of the vertical electrical element arrangement extends into the semiconductor substrate within a cell region of the semiconductor device. The plurality of drift regions and the plurality of compensation regions are arranged alternatingly in a lateral direction. The plurality of compensation regions comprises a first conductivity type and the plurality of drift regions comprises a second conductivity type. Further, the method comprises forming a non-depletable doping region extending laterally from an edge of the cell region towards an edge of the semiconductor substrate. The non-depletable doping region comprises a doping non-depletable by voltages applied to the semiconductor device during blocking operation. Further, the non-depletable doping region comprises the first conductivity type. The non-depletable doping region comprises a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a compensation region of the plurality of compensation regions to a closest contact area between the semiconductor substrate and an electrically conductive contact structure of the vertical electrical element arrangement within the cell region or at a position located closer to an edge of the semiconductor substrate than a gate field plate implemented by a lowest electrically conductive layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Some embodiments of apparatuses and/or methods will be described in the following by way of example only, and with reference to the accompanying figures, in which

FIG. 6 shows a schematic top view of a semiconductor device comprising a non-depletable doping region with higher doping at corner regions;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
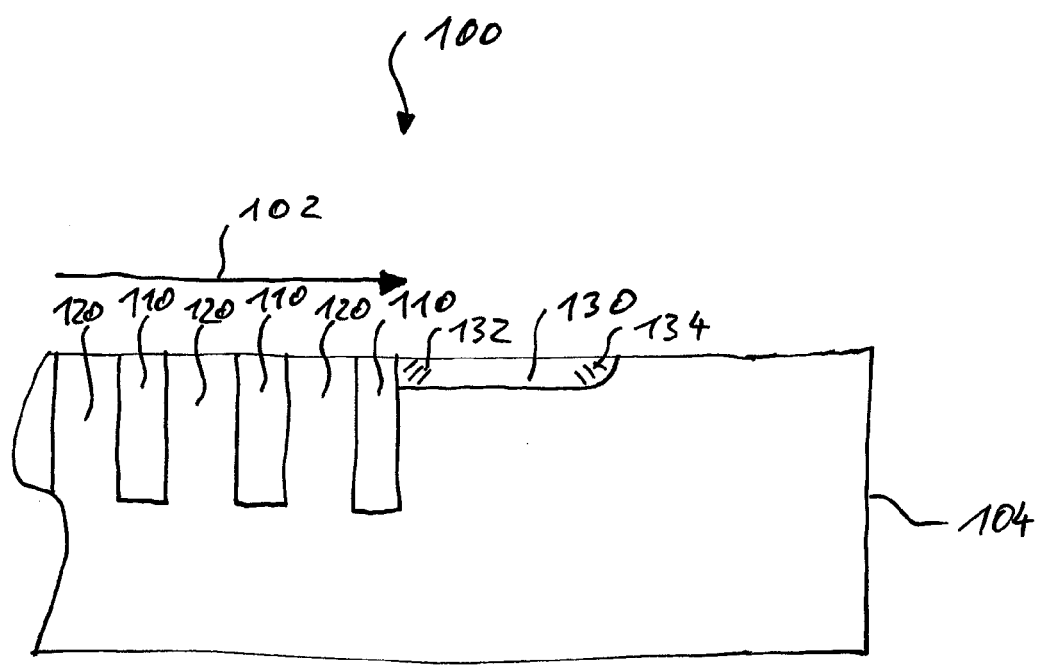
FIG. 1 shows a schematic cross section of a part of a semiconductor device.

FIG. 1 shows a semiconductor device 100 according to an embodiment. The semiconductor device 100 comprises a plurality of compensation regions 110 of a vertical electrical element arrangement, a plurality of drift regions 120 of the vertical electrical element arrangement and a non-depletable doping region 130. The compensation regions 110 of the plurality of compensation regions are arranged in a semiconductor substrate of the semiconductor device 100. Further, the plurality of drift regions 120 of the vertical electrical element arrangement are arranged in the semiconductor substrate within a cell region 102 of the semiconductor device. The plurality of drift regions 102 and the plurality of compensation regions 110 are arranged alternatingly in a lateral direction.

The non-depletable doping region 130 extends laterally from an edge of the cell region 102 towards an edge 104 of the semiconductor substrate. The non-depletable doping region 130 comprises a doping non-depletable by voltages applied to the semiconductor device 100 during blocking operation. Further, the plurality of compensation regions 110 and the non-depletable doping region 130 comprise a first conductivity type and the plurality of drift regions 120 comprises a second conductivity type. The non-depletable doping region 130 comprises a maximal doping concentration 132 (or a maximal doping dose) at an area close to the cell region 102 and a lower doping concentration 134 (or a lower doping dose) of at least 10% of the maximal doping concentration 134 (or the maximal doping dose) of the non-depletable doping region 130 at a lateral distance of more than 20 µm to a closest contact area between the semiconductor substrate and an electrically conductive contact structure of the vertical electrical element arrangement within the cell region 102, at a lateral distance of more than a depth of a compensation region 110 of the plurality of compensation regions to a closest contact area between the semiconductor substrate and an electrically conductive contact structure of the vertical electrical element arrangement within the cell region 102 or at a position located closer to an edge 104 of the semiconductor substrate than a gate field plate implemented at a lowest electrically conductive layer.

The drift regions 120 within the cell region 102 of the semiconductor substrate and an edge region surrounding the cell region 102 may be flooded by free charge carriers (electrons and holes) in a reverse mode of a field effect transistor arrangement (e.g. forward mode of the body diode) or a forward mode of a diode arrangement. These charge carriers may be removed during commutation of the vertical electrical element arrangement leading to large current densities at the edge of the cell region 102, since charge carriers (holes or electrons) located within the edge region flow off through contacts at the edge of the cell region 102, for example. The non-depletable doping region 130 extending from the cell region 102 into the edge region may promote the removal of the charge carriers through the contacts at the edge of the cell region 102. The number of charge carriers still within the edge region may be significantly lower at the time of the transition to a blocking state of the vertical electrical element arrangement due to the non-depletable doping region 130. Further, the voltage drop over the vertical electrical element arrangement may be increased faster due to the lower amount of charge carriers to be removed after reaching the blocking state. An optimal or suitable doping of the non-depletable doping region 130 may be provided for a large current range caused by the fast varying conditions during commutation due to the lateral variation of the doping of the non-depletable doping region 130. By implementing the non-depletable doping region 130, the load or stress at the edge of the cell region 102 may be reduced. In this way, the reliability and/or durability of semiconductor device 100 may be improved.

The non-depletable doping region 130 comprises a laterally varying doping concentration or doping dose. Each part of the non-depletable doping region 130 may comprise at least a doping concentration or doping dose above a doping concentration or doping dose depletable by voltages applied to the semiconductor device during blocking operation. The vertical electrical element arrangement of the semiconductor device may be in a blocking state (e.g. reverse or blocking mode of a diode or forward mode with closed gate of a field effect transistor) during the blocking operation of the semiconductor device. The vertical electrical element arrangement may substantially block a current flow through the vertical electrical element arrangement in a blocking state.

For example, a depletion region (e.g. between the non-depletable doping region and an adjacent region of the second conductivity type) does not expand over the whole non-depletable doping region during blocking operation of the semiconductor device 100. For example, the non-depletable doping region 130 may comprise an incorporated doping dose of at least $2.5*10^{12}$ cm$^{-2}$ (or more than $4*10^{12}$ cm$^{-2}$ or more than $7*10^{12}$ cm$^{-2}$). In other words, the whole area of the non-depletable doping region 130 may comprise a doping dose of at least $2.5*10^{12}$ cm$^{-2}$. The doping dose of an area of the non-depletable doping region 130 may be a vertically summed number of dopants per unit area of the non-depletable doping region 130.

The blocking operation may be one of several operation modes during normal operation of the semiconductor device 100. For example, voltages above the breakdown voltage or maximal blocking voltage specified for the semiconductor device 100 (e.g. defined in the data sheet of the semiconductor device) do not occur during normal operation of the semiconductor device 100. For example, the normal operation may include commutating the semiconductor device 100 and/or switching the vertical electrical element arrangement from an on-state to an off-state and vice versa.

The non-depletable doping region 130 extends from (at least) an edge of the cell region 102 towards an edge 104 of the semiconductor substrate. The cell region 102 (or cell field or active region) of the semiconductor device 100 may be located in proximity to or centered to a center of the semiconductor device 100. The cell region 102 of the semiconductor device 100 may occupy more than 50% of the surface of the semiconductor device, for example. The majority (e.g. more than 90%) or the complete current flowing between the front side and the back side of the semiconductor substrate in an on-state or non-blocking state (e.g. forward mode of a diode or reverse mode of a field effect transistor) of the vertical electrical element arrangement may flow through the cell region 102 of the semiconductor substrate.

The edge of the cell region 102 may be represented or formed by an outermost doping region (e.g. body region) of the vertical electrical element arrangement connected to an electrically conductive contact structure (e.g. source electrode structure) of the vertical electrical element arrangement within the cell region. The electrically conductive contact structure may be in contact with the outermost doping region at a surface of the semiconductor substrate. The electrically conductive contact structure may comprise a metal layer structure (e.g. copper or aluminum and optional barrier layer, e.g. titanium silicide) or a poly silicon structure in contact with the semiconductor substrate. Alternatively, the edge of the cell region 102 may be represented or formed by a contact area of an electrically conductive contact structure and the non-depletable doping region 130 at a surface of the semiconductor substrate, if the electrically conductive contact structure is short cut (short circuited) to a doping region (e.g. body region or source region) of the vertical electrical element arrangement. For example, normal field effect transistor cells and transition cells may be arranged within the cell region of a field effect transistor arrangement representing the vertical electrical element arrangement. The transition cells may be located at the edge of the cell region and may be implemented with different geometry and/or without source region so that no current flows through the transition cells in an on-state of the field effect transistor arrangement. However, the transition cells may be connected to an electrically conductive contact structure so that an edge current may flow off through the electrically conductive contact structure during commutation.

For example, the non-depletable doping region 130 may extend laterally from a doping region of the vertical electrical element arrangement connected to an electrically conductive contact structure of the vertical electrical element arrangement towards the edge 104 of the semiconductor device or may extend laterally from an electrically conductive contact structure of the vertical electrical element arrangement within the cell region 102 towards the edge of the semiconductor device. The doping region of the vertical electrical element arrangement (being connected to the non-depletable doping region) may be an anode region, a cathode region, a source region, drain region, a body region, an emitter region, a collector region or a base region of the vertical electrical element arrangement.

For example, the non-depletable doping region 130 may be located in the semiconductor substrate so that an ohmic path exists (within the semiconductor substrate) between the non-depletable doping region 130 and an electrically conductive contact structure of the vertical electrical element arrangement within the cell region 102. For example, non-depletable doping region 130 may be located adjacent to a body region of the first conductivity type and the body region is connected to an electrically conductive contact structure (e.g. source electrode structure) of the vertical electrical element arrangement within the cell region.

The cell region 102 may be laterally surrounded by an edge termination region. The edge termination region may extend from an edge 104 of the semiconductor substrate of the semiconductor device 100 (e.g. semiconductor die) laterally towards the cell region 102. The edge termination region may comprise a lateral width measured from an edge of the semiconductor substrate towards the cell region 102 of less than 500 µm and more than 50 µm (or less than 300 µm and more than 100 µm), for example.

The non-depletable doping region 130 comprises a maximal doping concentration 132 (or maximal doping dose) at an area close to the cell region 102. An area close to the cell region 102 may be an area in the proximity of a lateral end (e.g. last 20% of a lateral extension of the non-depletable doping region) of the non-depletable doping region 130 located at the edge of the cell region 102. For example, the area close to the cell region 102 is an area of the non-depletable doping region 130 located closer to the cell region 102 than an area comprising the lower doping concentration 134. The maximal doping concentration 132 may be the highest doping concentration within the non-depletable doping region 130. For example, the non-depletable doping region 130 may comprise a maximal doping concentration 132 of more than $1*10^{16}$ cm$^{-3}$ (or more than $2*10^{16}$ cm−3 or more than $1*10^{17}$ cm$^{-3}$).

The non-depletable doping region 130 comprises a lower doping concentration 134 (or lower doping dose) of at least 10% (or of at least 20% or of at least 30%) of the maximal doping concentration 132 at an area closer to the edge of the semiconductor device than the area comprising the maximal doping concentration. For example, the area with the lower doping concentration 134 may be still non-depletable.

For example, a portion of the non-depletable doping region 130 comprising 50% of the maximal doping concentration is located laterally within an interval of 20% to 80% of a distance between the area comprising the maximal doping concentration 132 and the area comprising the lower doping concentration 134.

The area (or at least one area) of the non-depletable doping region 130 comprising the lower doping concentration 134 may be located at a lateral distance of more than 20 µm to a closest contact area (e.g. source contact and/or body contact) between the semiconductor substrate and an electrically conductive contact structure (e.g. source electrode structure and/or body electrode structure) of the vertical electrical element arrangement within the cell region 102.

Alternatively, the area (or at least one area) of the non-depletable doping region 130 comprising the lower doping concentration 134 may be located at a lateral distance of more than a depth of a drift zone or a compensation region 110 of the plurality of compensation regions 110 to a closest contact area (e.g. source contact and/or body contact) between the semiconductor substrate and an electrically conductive contact structure of the vertical electrical element arrangement within the cell region 102. The closest contact area may be the outermost contact area of the vertical electrical element arrangement within the cell region 102, for example. The drift zone of the vertical electrical element arrangement may be a lightly doped region of the semiconductor substrate (e.g. below $1*10^{17}$ cm$^{-3}$) located between a front side doping region of the vertical electrical element arrangement (e.g. body region, anode region or cathode region) and a highly doped region of the semiconductor substrate (e.g. between $1*10^{19}$ cm$^{-3}$ and $1*10^{21}$ cm$^{-3}$). Optionally, a field stop layer or buffer layer may be arranged between the drift zone and the highly doped region of the semiconductor substrate.

Further alternatively, the area (or at least one area) of the non-depletable doping region 130 comprising the lower doping concentration 134 may be located at a position located closer to an edge 104 of the semiconductor substrate than a field plate implemented at a lowest electrically conductive layer. For example, the vertical electrical element arrangement may comprise a gate electrode structure connecting one or more gates of the vertical electrical element arrangement with a gate pad, if the vertical electrical element arrangement is a field effect transistor arrangement. The gate electrode structure may comprise a gate field plate covering a field oxide edge in proximity to the edge of the cell region 102. The gate field plate may be implemented by an electrically conductive layer (e.g. poly silicon layer or metal layer) being the lowermost electrical conductive layer formed on the front side of the semiconductor substrate. The field oxide may be an oxide layer covering the edge termination region without covering the cell region 102 so that an edge of the field oxide layer occurs in proximity to the edge of the cell region 102.

The non-depletable doping region 130 may comprise a thickness (vertical dimension) of less than 5 µm (or less than 3 µm or less than 2 µm). For example, the non-depletable doping region 130 may extend into a larger depth of the semiconductor substrate than a body region of the vertical electrical element arrangement.

The non-depletable doping region 130 may be located adjacent to a surface of the semiconductor substrate. In other words, the non-depletable doping region 130 may be located directly at the (front side) surface of the semiconductor substrate. Alternatively, the non-depletable doping region 130 may be buried within the semiconductor substrate. For example, a semiconductor layer comprising the second conductivity type may be located between the non-depletable doping region 130 and the (front side) surface of the semiconductor substrate.

The plurality of compensation regions 110 may be regions of the semiconductor substrate comprising a stripe-shape, a circular-shape or a hexagonal shape in a top view of the semiconductor device 100. A stripe-shape may be a geometry extending in a first lateral direction significantly farther than in an orthogonal second lateral direction. For example, a compensation region 110 may comprise a lateral length of more than 10× (or more than 50× or more than 100×) a lateral width of a compensation region 110 of the plurality of compensation regions. The lateral length of the compensation regions 110 may be the largest extension along the front side surface of the semiconductor substrate and a lateral width (e.g. between 1 µm and 5 µm or between 2 µm and 3 µm) of the compensation region may be a shortest dimension of the compensation regions 110. The compensation regions of the plurality of compensation regions may all comprise the same lateral length and/or the same lateral width. Alternatively, the lateral length and/or the lateral width of the compensation regions of the plurality of compensation regions 110 may differ at least partly from each other.

Further, the compensation regions of the plurality of compensation regions 110 comprise a vertical extension (e.g. vertical depth). In other words, the compensation regions 110 may be laminar structures or may comprise the geometry of a pillar, a wall or a plate. The vertical extension may be larger than the lateral width and shorter than the lateral length, for example. For example, the compensation regions of the plurality of compensation regions 110 extend from a front side surface of the semiconductor substrate into a depth of more than 10 μm (or more than 20 μm or more than 50 μm). For example, a compensation region of the plurality of compensation regions 110 may extend from a body region of the vertical electrical element arrangement vertically into the semiconductor substrate.

For example, the compensation regions 110 of the plurality of compensation regions may extend laterally in one direction through the whole cell region 102. Optionally, the compensation regions 110 of the plurality of compensation regions extend in the one direction also into the edge termination region. Alternatively, the compensation regions 110 of the plurality of compensation regions may be significantly smaller than a lateral extension of the cell region 102 (e.g. several compensation structures may be arranged in a line and several lines of compensation structures may be arranged in parallel to each other). For example, at least a part of the compensation regions 110 of the plurality of compensation regions may be arranged substantially in parallel to each other (e.g. neglecting manufacturing tolerances).

In a cross-section orthogonal to the lateral length of the cell compensation regions 110, the compensation regions may comprise a pillar shape or column shape. The plurality of compensation regions 110 are arranged alternating to the plurality of drift regions 120 of the vertical electrical element arrangement (in a cross section orthogonal to a lateral length of the compensation regions). In other words, a drift region of the vertical electrical element arrangement may extend into the semiconductor substrate between two compensation regions 110 within the cell region 102 of the semiconductor device 100.

The plurality of drift regions 120 may be part of a common drift zone of the vertical electrical element arrangement. For example, the drift regions 120 may extend from body regions or the surface of the vertical electrical element arrangement between the compensation regions 110 vertically into the semiconductor substrate. The drift regions 120 may be separated from each other by the compensation regions 110 down to the depth of the compensation regions. The drift regions may be connected to each other below the compensation regions 110 by a common or shared part of the drift zone, for example. The drift regions 120 may carry the majority or the complete current flowing between the front side and the back side of the semiconductor substrate in an on-state of the vertical electrical element arrangement.

The semiconductor device 100 may be a compensation device (super junction device). Compensation devices may be based on mutual compensation of at least a part of the charge of n- and p-doped areas in the drift region of the vertical electrical element arrangement. For example, in a vertical transistor, p- and n-pillars or plates (plurality of drift regions and plurality of compensation regions) may be arranged in pairs. For example, a compensation region 110 of the plurality of compensation regions 110 comprises a laterally summed number of dopants per unit area of the first conductivity type (p or n) deviating from half of a laterally summed number of dopants per unit area of the second conductivity type (n or p) comprised by two drift regions located adjacent to opposite sides of the compensation region by less than +/−25% (or less than 15%, less than +/−10%, less than +/−5%, less than 2% or less than 1%) of the laterally summed number of dopants per unit area of the first conductivity type comprised by the compensation region. The lateral summed number of dopants per unit area may be substantially constant or may vary for different depths. The lateral summed number of dopants per unit area may be equal or proportional to a number of free charge carriers within a compensation region 110 or a drift region to be compensated in a particular depth, for example.

A region comprising the first conductivity type may be a p-doped region (e.g. caused by incorporating aluminum ions or boron ions) or an n-doped region (e.g. caused by incorporating antimony ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

For example, the semiconductor substrate may be part of a semiconductor wafer or a semiconductor die. The semiconductor substrate of the semiconductor device 100 may be a silicon substrate, a silicon carbide substrate, a gallium arsenide substrate or a gallium nitride substrate, for example.

The surface (e.g. front side surface or main surface) of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the surface of the semiconductor substrate may be a basically horizontal surface extending laterally. The surface of the semiconductor substrate may be a basically even plane (e.g. neglecting unevenness of the semiconductor structure due to the manufacturing process or trenches). In other words, the surface of the semiconductor substrate may be the interface between the semiconductor material and an insulation layer, metal layer or passivation layer on top of the semiconductor substrate.

For example, a lateral direction or lateral expansion may be oriented basically in parallel to the front side surface or back side surface and a vertical direction or vertical expansion may be oriented basically orthogonal to the front side surface.

The vertical electrical element arrangement may be a field-effect transistor arrangement (e.g. metal oxide semiconductor transistor or insulated gate bipolar transistor) or a diode arrangement, for example. The vertical electrical element arrangement may comprise a plurality of cells or repeated structures (e.g. field effect transistor cells, metal oxide semiconductor transistor cells or insulated gate bipolar transistor cells) within the cell field. For example, a field effect transistor cell may comprise a source region, a body region, a drain region (e.g. shared with other cells) and a gate for controlling a channel through the body region.

For example, the non-depletable doping region 130 may be located at least at a part of the edge of the cell region arranged laterally farther away from a gate pad of the field effect transistor arrangement than 50% of the edge of the cell region. In other words, each part of the edge of the cell region comprises a defined distance to (a closest part of) the gate pad and for half of the edge of the cell region, the defined distance is larger than for the other half of the edge of the cell region. The non-depletable doping region 130 may be located at least at a part of the edge of the cell region comprising a larger distance to the gate pad than 50% of the edge of the cell region. Alternatively, or additionally, the non-depletable doping region 130 may be located at least at a part of the edge of the cell region located at a first half of the semiconductor substrate, while the gate pad is located in the second half of the semiconductor substrate. Nevertheless, the part of the non-depletable doping region 130 may be located at a part of the edge of the cell region located close to the gate pad and/or below the gate pad as well.

For example, the semiconductor device 100 may be a power semiconductor device comprising a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V).

Figure 2:
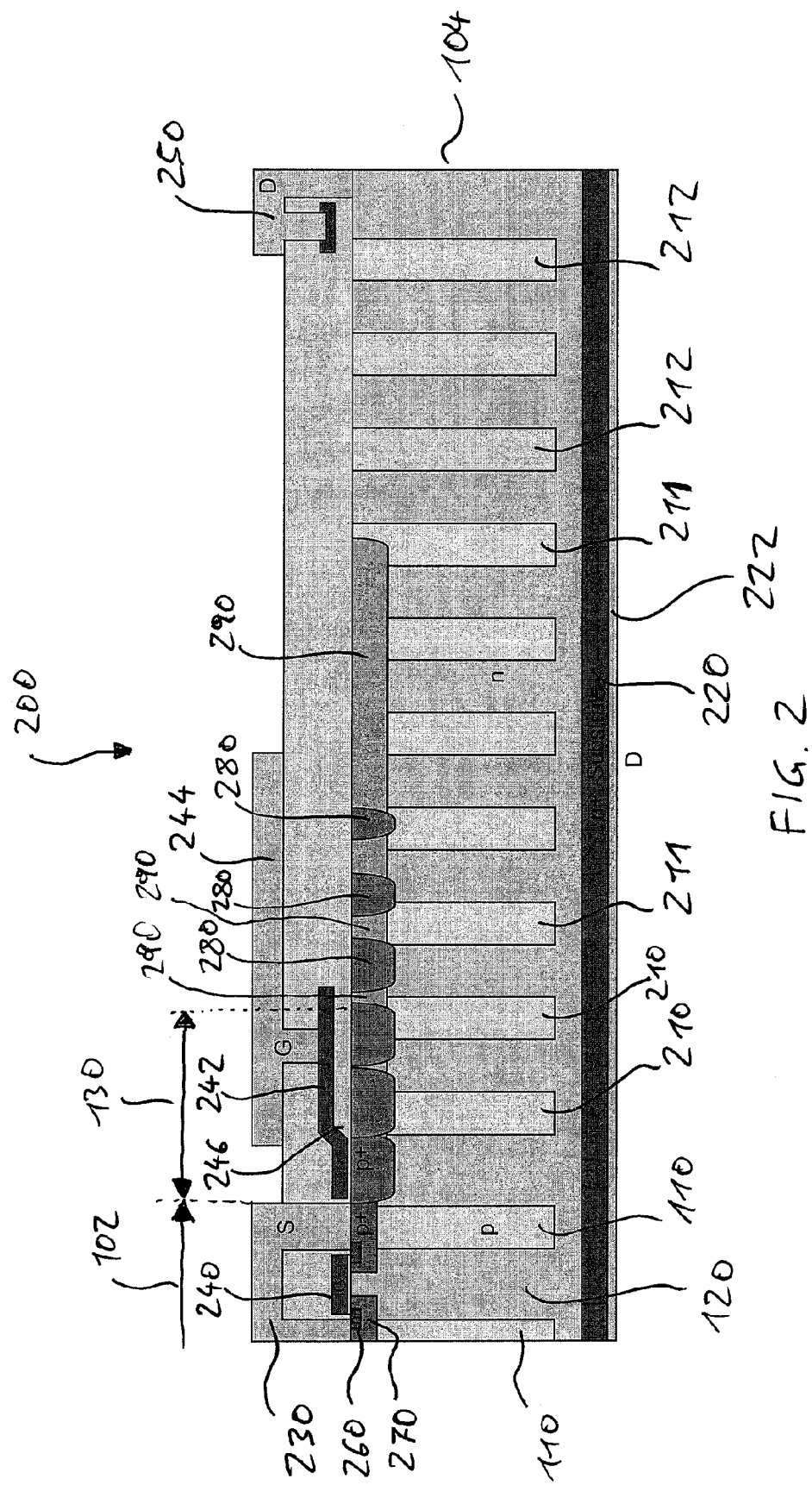
FIG. 2 shows a schematic cross section of a part of a semiconductor device comprising a field effect transistor arrangement.

FIG. 2 shows a semiconductor device 200 according to an embodiment. The semiconductor device 200 is implemented similar to the semiconductor device shown in FIG. 1. In the example of FIG. 2, the vertical electrical element arrangement is a compensation or super junction field effect transistor arrangement. The vertical electrical element arrangement comprises a plurality of transistor cells within the cell region 102. Each transistor cell comprises a source region 260 (e.g. highly n-doped) and a body region 270 (e.g. highly p-doped) and a gate 240 for controlling a channel through the body region 270. A drift region 120 and/or the drain region 220 (e.g. highly n-doped substrate) within the semiconductor substrate as well as a drain electrode 222 (drain metallization) may be shared by two or more or all transistor cells of the vertical electrical element arrangement. The source regions 260 and the body regions 270 of the vertical electrical element arrangement are short-circuited by a source electrode structure 230 in contact with the source regions 260 and the body regions 270 at a surface of the semiconductor substrate. The gates 240 of the vertical electrical element arrangement are connected to a gate runner 244 or a gate pad by a gate electrode structure. The gate electrode structure may comprise a gate field plate 242 surrounding the cell region at a lowest electrical conductive layer and a gate ring or gate pad 244 located at least partly above the gate field plate 242. The gate ring or gate pad 244 may be implemented within the uppermost electrically conductive layer (e.g. copper layer). Further, a drain ring 250 surrounds the semiconductor substrate at the edge 104 or close to the edge 104 of the semiconductor substrate. In this example, the semiconductor substrate is a silicon substrate.

The non-depletable doping region 130 extends laterally from a body region of the vertical electrical element arrangement to substantially an edge of the gate field plate 242. For example, the non-depletable p-doping region 130 may be located below the gate poly (gate field plate) and gate pad G. The non-depletable doping region 130 may extend laterally over more than 20 μm in a direction from the cell region to the edge 104 of the semiconductor substrate, for example.

Further highly doped doping regions 280 (e.g. comprising also a non-depletable doping) may be located with different distances to the non-depletable doping region 130 and closer to the edge of the semiconductor device 104 than the non-depletable doping region 130. The further highly doped doping regions 280 may be connected to the highly doped doping regions 280 by one or more depletable doping regions 290.

Additionally, the semiconductor device 200 may comprise a plurality of edge termination compensation regions 210 of the first conductivity type located outside the cell region 102, which are directly connected to the non-depletable doping region 130. Further edge termination compensation regions 211 may be located within the edge termination region, which are indirectly connected to the non-depletable doping region 130 by one or more depletable doping regions 290. Additional edge termination compensation regions 212 may be located within the edge termination region, which are not connected to the non-depletable doping region 130, for example.

The p+-region 130 (p-doped non-depletable doping region) may overlap with the last contacted body region to discharge the holes through a low ohmic path. Optionally, the p-region 130 (p-doped non-depletable doping region) may overlap with the lightly doped p-junction termination extension (JTE) 290 at the edge side. The p+-region 130 may be lower doped than the body region, but may nevertheless reach deeper, since the temperature budget may be higher. The p-junction termination extension (JTE) may be implemented in a buried manner. In this way, the columns (compensation regions) may extend not to the surface too so that the surface field may be more homogeneous so that the ionization integral of the current flow may be reduced and the dynamic breakdown voltage may be increased, for example.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-9).

The doping profile of the non-depletable doping region 130 of a semiconductor device according to the described concept or one or more embodiments above or below may comprise various characteristics. For example, a lateral profile of the doping concentration of the non-depletable doping region 130 may be on average decreasing from the area comprising the maximal doping concentration 132 of the non-depletable doping region to the area comprising the lower doping concentration 134. For example, the doping concentration may decrease substantially linearly from the area comprising the maximal doping concentration 132 of the non-depletable doping region to the area comprising the lower doping concentration 134.

Alternatively, the lateral profile of the doping concentration of the non-depletable doping region 130 may comprise a plurality of local maxima and local minima between the area comprising the maximal doping concentration 132 of the non-depletable doping region to the area comprising the lower doping concentration 134. For example, neighboring local maxima and local minima of the plurality of local maxima and local minima may differ by more than 10% (or more than 20% or more than 30%) of the maximal doping concentration 132. The doping concentration of local maxima and local minima may decrease monotonically or even substantially linearly from the area comprising the maximal doping concentration 132 of the non-depletable doping region to the area comprising the lower doping concentration 134.

Figure 3:
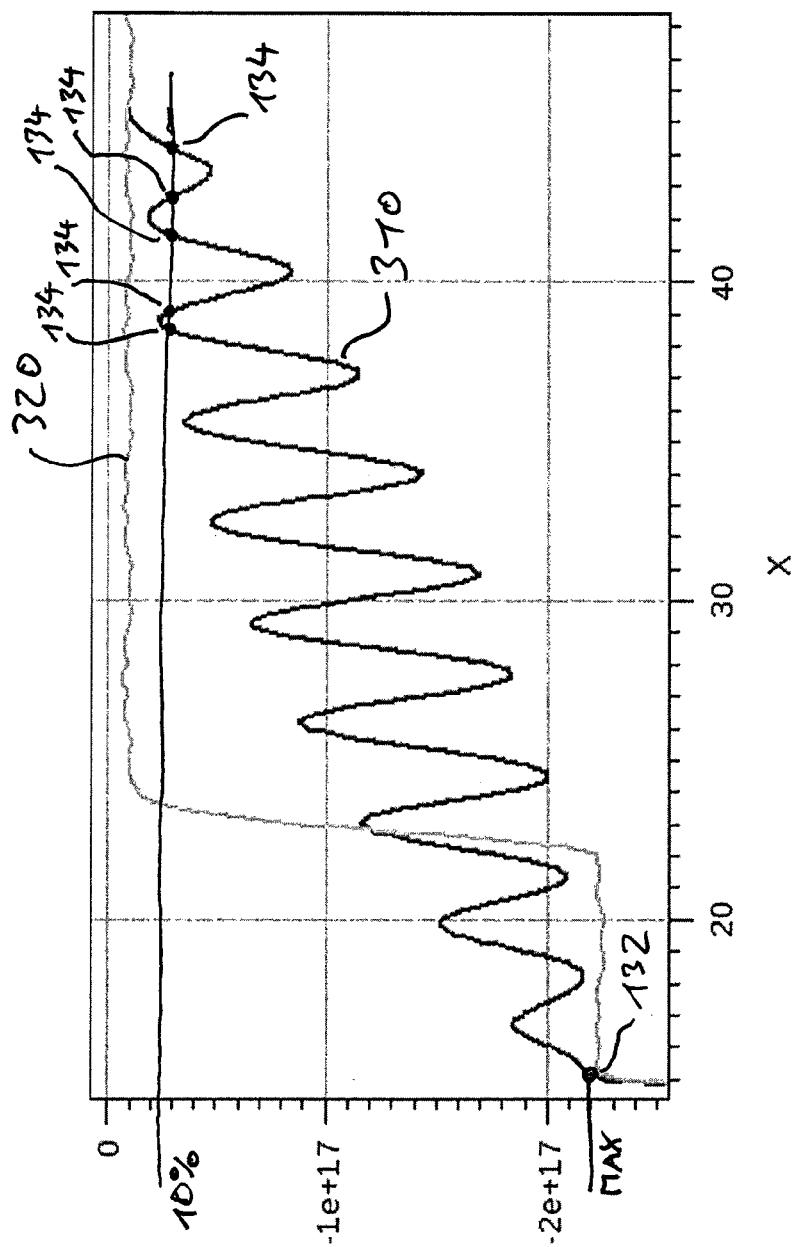
FIG. 3 shows a schematic illustration of a doping profile of a non-depletable doping region.

FIG. 3 shows an example of a doping profile 310 (doping concentration vs. lateral distance) along a lateral cut slightly below the semiconductor surface of a non-depletable doping region according to the described concept comprising local maxima and minima in comparison to a doping profile 320 of a short non-depletable doping region with substantially constantly high doping concentration. The doping profile 310 comprises more than one area comprising the lower doping concentration 134 of 10% of the maximal doping concentration 132 due to the oscillation of the doping profile over the distance. At least one of the areas with the lower doping concentration 134 may be located at a lateral distance of more than 20 µm to a closest contact area between the semiconductor substrate and an electrically conductive contact structure of the vertical electrical element arrangement within the cell region, at a lateral distance of more than a depth of a compensation region of the plurality of compensation regions to a closest contact area between the semiconductor substrate and an electrically conductive contact structure of the vertical electrical element arrangement within the cell region or at a position located closer to an edge of the semiconductor substrate than a field plate implemented by a lowest electrically conductive layer.

For example, FIG. 3 shows a net doping along the surface (of the semiconductor substrate). The doping profile may show a possible characteristic of a linearly graded region. The doping may decrease linearly on average. More or less high mountains and valleys (maxima and minima) as well as a more or less high maximum concentration may remain depending on the out-diffusion.

Figure 4:
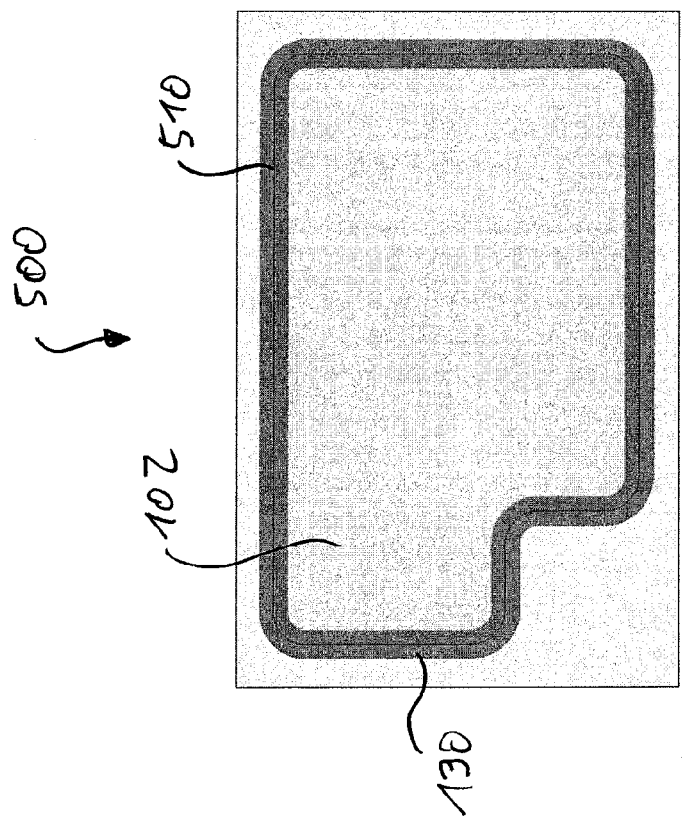
FIG. 4 shows a schematic top view of a semiconductor device comprising a non-depletable doping region surrounding a cell region.

FIG. 4 shows a schematic top view of a semiconductor device 500 according to an embodiment. The semiconductor device 500 comprises a non-depletable doping region 130 surrounding a cell region 102. In this example, the non-depletable doping region 130 is located below a field oxide edge 510 of the semiconductor device 500.

For example, FIG. 4 shows a chip layout with gate pad in the corner. The field oxide edge 510 may be located at the edge of the active region 102.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3) or below (e.g. FIGS. 7-9).

Figure 5:
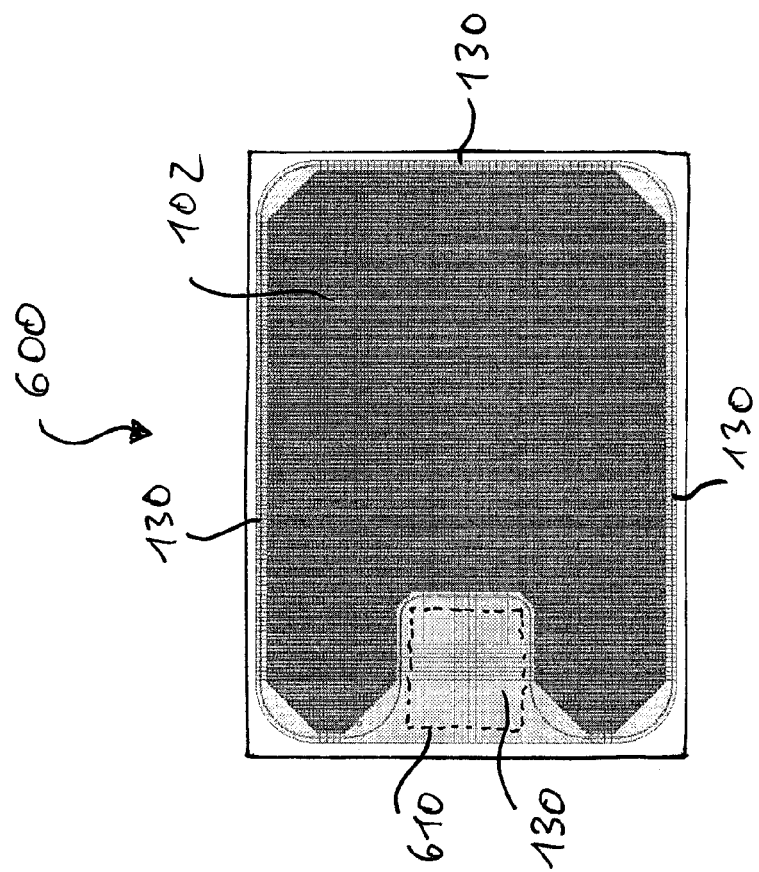
FIG. 5 shows a schematic top view of a semiconductor device comprising a non-depletable doping region reaching below the gate pad.

Optionally, the non-depletable doping region may extend laterally below at least a part of a gate pad of the semiconductor device. FIG. 5 shows a schematic top view of semiconductor device 600 according to an embodiment. The semiconductor device 600 comprises a non-depletable doping region 130 reaching below the gate pad 610.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-3) or below (e.g. FIGS. 7-9).

Optionally, the non-depletable doping region may comprise an average doping concentration at a corner region of the cell region being larger than an average doping concentration at an edge of the cell region extending substantially in parallel to an edge of the semiconductor substrate for more than 200 µm. FIG. 6 shows a schematic top view of semiconductor device 700 according to an embodiment. The semiconductor device 700 comprises a non-depletable doping region with higher doping at corner regions 732. The corner regions 732 may comprise a higher doping concentration than parts 734 of the non-depletable doping region extending in parallel to an edge of the semiconductor substrate.

For example, FIG. 4 shows a chip layout with gate pad in the corner. The field oxide edge 510 is located at the edge of the active region 102. The p-region (the non-depletable doping region) may be implemented with higher doping at the corners 732 by larger holes (within the implant mask) and/or smaller distances (of the holes in the implant mask).

For example, more holes have to be discharged at the regions of the corners or the gate pad, since the hole back-flow of the holes at a chip depends on the geometry. Therefore, the p-doping (doping of the non-depletable doping region) may be adapted to the different current densities. For example, the implantation holes may be designed larger and/or the distances smaller at least at the regions of the outer corners than at the long side.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIGS. 1-3) or below (e.g. FIGS. 7-9).

Alternatively, a plurality of non-depletable doping regions may be located at corner regions of the cell region, while the plurality of non-depletable doping regions are interrupted at edges of the cell region extending substantially in parallel to an edge of the semiconductor substrate for more than 200 µm. It may be sufficient to arrange proposed non-depletable doping regions at corner regions of the cell field to improve the reliability and/or durability of semiconductor devices.

Figure 7:
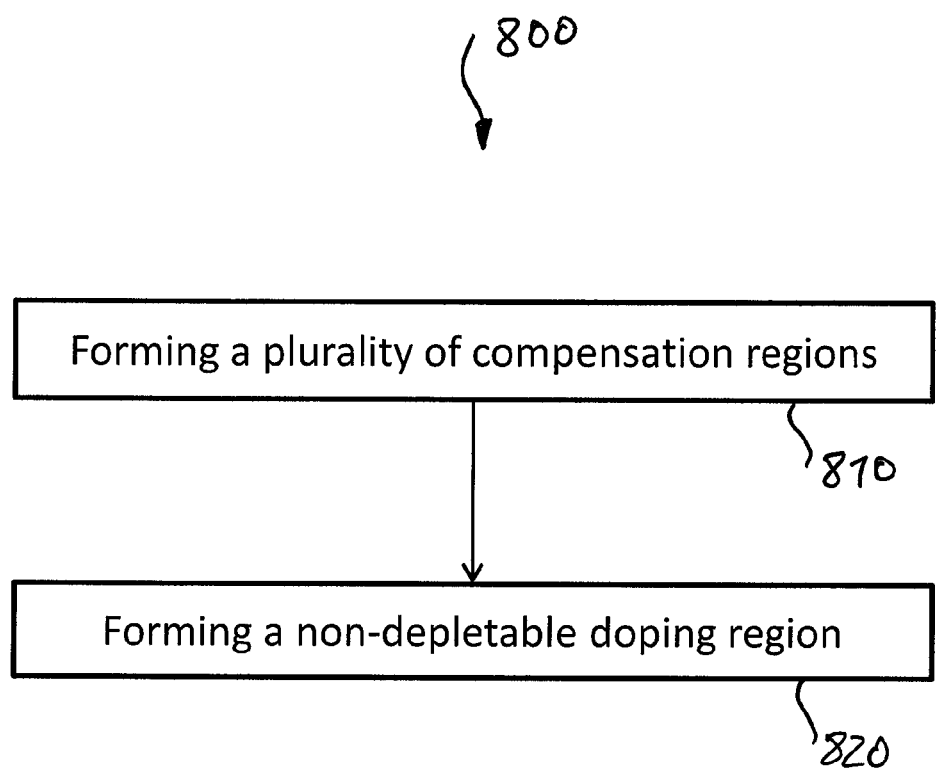
FIG. 7 shows a flow chart of a method for forming a semiconductor device.

FIG. 7 shows a flow chart of a method for forming a semiconductor device according to an embodiment. The method 800 comprises forming 810 a plurality of compensation regions of a vertical electrical element arrangement. The compensation regions of the plurality of compensation regions extend into a semiconductor substrate of the semiconductor device. Further, a plurality of drift regions of the vertical electrical element arrangement extends into the semiconductor substrate within a cell region of the semiconductor device. The plurality of drift regions and the plurality of compensation regions are arranged alternatingly in a lateral direction. The plurality of compensation regions comprises a first conductivity type and the plurality of drift regions comprises a second conductivity type.

Further, the method 800 comprises forming 820 a non-depletable doping region extending laterally from an edge of the cell region towards an edge of the semiconductor substrate. The non-depletable doping region comprises a doping non-depletable by voltages applied to the semiconductor device during blocking operation. Further, the non-depletable doping region comprises the first conductivity type. The non-depletable doping region comprises a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a compensation region of the plurality of compensation regions to a closest contact area between the semiconductor substrate and an electrically conductive contact structure of the vertical electrical element arrangement within the cell region or at a position located closer to an edge of the semiconductor substrate than a gate field plate implemented by a lowest electrically conductive layer.

The non-depletable doping region extending from the cell region into the edge region may promote the removal of the charge carriers through the contacts at the edge of the cell region. By implementing the non-depletable doping region, the load or stress at the edge of the cell region may be reduced. In this way, the reliability and/or durability of semiconductor device may be improved.

The varying doping concentration of the non-depletable doping region may be formed 820 in various ways. For example, forming 820 the non-depletable doping region may comprise forming an implant mask on the semiconductor substrate. The implant mask may comprise holes with decreasing size or increasing distance to each other from an area planned to obtain the maximal doping concentration of the non-depletable doping region to an area planned to obtain the lower doping concentration. In this way, the non-depletable doping region may be implemented with a varying doping concentration or varying doping dose, although the implant was done with a substantially constant doping dose for the whole area of the non-depletable doping region, for example. The holes within the mask may comprise a circular shape, a polygonal shape or a strip shape (e.g. surrounding the cell region) or a continuous region with a geometry inverse to circles, polygons and/or stripes.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIGS. 1-6) or below (e.g. FIGS. 8-9).

Figure 8:
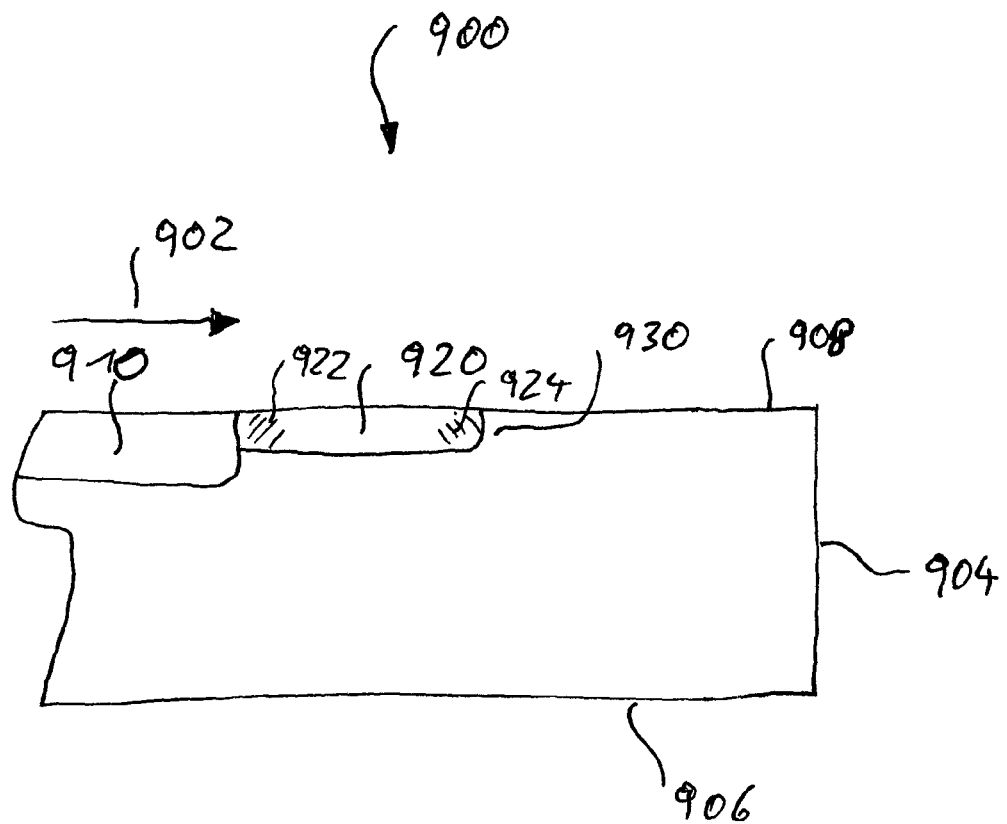
FIG. 8 shows a schematic cross section of a part of a semiconductor device.

FIG. 8 shows a schematic cross section of a part of a semiconductor device 900 according to an embodiment. The semiconductor device 900 comprises a vertical electrical element arrangement 910 and a non-depletable doping region 920. The vertical electrical element arrangement 910 enables a current flow between a front side 908 and a back side 906 of a semiconductor substrate of the semiconductor device.

Further, the non-depletable doping region 920 extends laterally from an edge of a cell region of the semiconductor substrate towards an edge 904 of the semiconductor substrate. The non-depletable doping region 920 comprises a doping non-depletable by voltages applied to the semiconductor device 900 during blocking operation. The non-depletable doping region 920 comprises a first conductivity type. The non-depletable doping region 920 comprises a maximal doping concentration 922 at an area close to the cell region 902 and a lower doping concentration 924 of at least 10% of the maximal doping concentration of the non-depletable doping region 920 at a lateral distance of more than 20 µm to a closest contact area between the semiconductor substrate and an electrically conductive contact structure of the vertical electrical element arrangement 910 within the cell region 902, at a lateral distance of more than a depth of a drift zone of the vertical electrical element arrangement 910 to a closest contact area between the semiconductor substrate and an electrically conductive contact structure of the vertical electrical element arrangement 910 within the cell region 902 or at a position located closer to an edge of the semiconductor substrate than a gate field plate implemented by a lowest electrically conductive layer. Further, a lateral distance between a part of the non-depletable doping region 920 comprising the lower doping concentration 924 and a doping region 930 of the semiconductor substrate comprising a second conductivity type and located outside the cell region 902 is lower than 20 µm.

The non-depletable doping region extending from the cell region into the edge region may promote the removal of the charge carriers through the contacts at the edge of the cell region. By implementing the non-depletable doping region, the load or stress at the edge of the cell region may be reduced. In this way, the reliability and/or durability of semiconductor device may be improved.

Aspects and details regarding a non-depletable doping region, a non-depletable doping, a blocking operation of the semiconductor device, a maximal doping concentration of the non-depletable doping region, a lower doping concentration of the non-depletable doping region, compensation regions, a gate field plate, a cell region, a vertical electrical element arrangement, a semiconductor substrate, a semiconductor device and other features mentioned in connection with the example of FIG. 8 are described in connection with the example shown in FIG. 1 or another embodiment described above or below, for example.

The lateral distance between a part of the non-depletable doping region 920 comprising the lower doping concentration 924 and a doping region 930 of the second conductivity type located outside the cell region 902 is lower than 20 µm (or lower than 10 µm or lower than 5 µm or lower than 1 µm). The implementation of the non-depletable doping region 920 may significantly reduce the load or stress at the edge of the cell region during commutating the semiconductor device 900. Therefore, an additional implementation of a depletable doping region joining the non-depletable doping region 920 and extending further towards the edge 904 of the semiconductor substrate may be avoided or not necessary, for example. Consequently, a fast transition of the non-depletable doping concentration at the part of the non-depletable doping region 920 comprising the lower doping concentration 924 to a part of the semiconductor substrate comprising the second conductivity type may be implemented.

The vertical electrical element arrangement 910 may be a field-effect transistor arrangement (e.g. metal oxide semiconductor transistor or insulated gate bipolar transistor) or a diode arrangement, for example. The vertical electrical element arrangement may comprise a plurality of cells or repeated structures (e.g. field effect transistor cells, metal oxide semiconductor transistor cells or insulated gate bipolar transistor cells) within the cell field. For example, a field effect transistor cell may comprise a source region, a body region, a drain region (e.g. shared with other cells) and a gate for controlling a channel through the body region.

For example, the non-depletable doping region 920 may be located at least at a part of the edge of the cell region arranged laterally farther away from a gate pad of the field effect transistor arrangement than 50% of the edge of the cell region. In other words, each part of the edge of the cell region comprises a defined distance to (a closest part of) the gate pad and for half of the edge of the cell region, the defined distance is larger than for the other half of the edge of the cell region. The non-depletable doping region 920 may be located at least at a part of the edge of the cell region comprising a larger distance to the gate pad than 50% of the edge of the cell region. Alternatively, or additionally, the non-depletable doping region 920 may be located at least at a part of the edge of the cell region located at a first half of the semiconductor substrate, while the gate pad is located in a second half of the semiconductor substrate. Nevertheless, the non-depletable doping region 920 may be located at a part of the edge of the cell region located close to the gate pad and/or below the gate pad as well.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIGS. 1-7) or below (e.g. FIG. 9).

Figure 9:
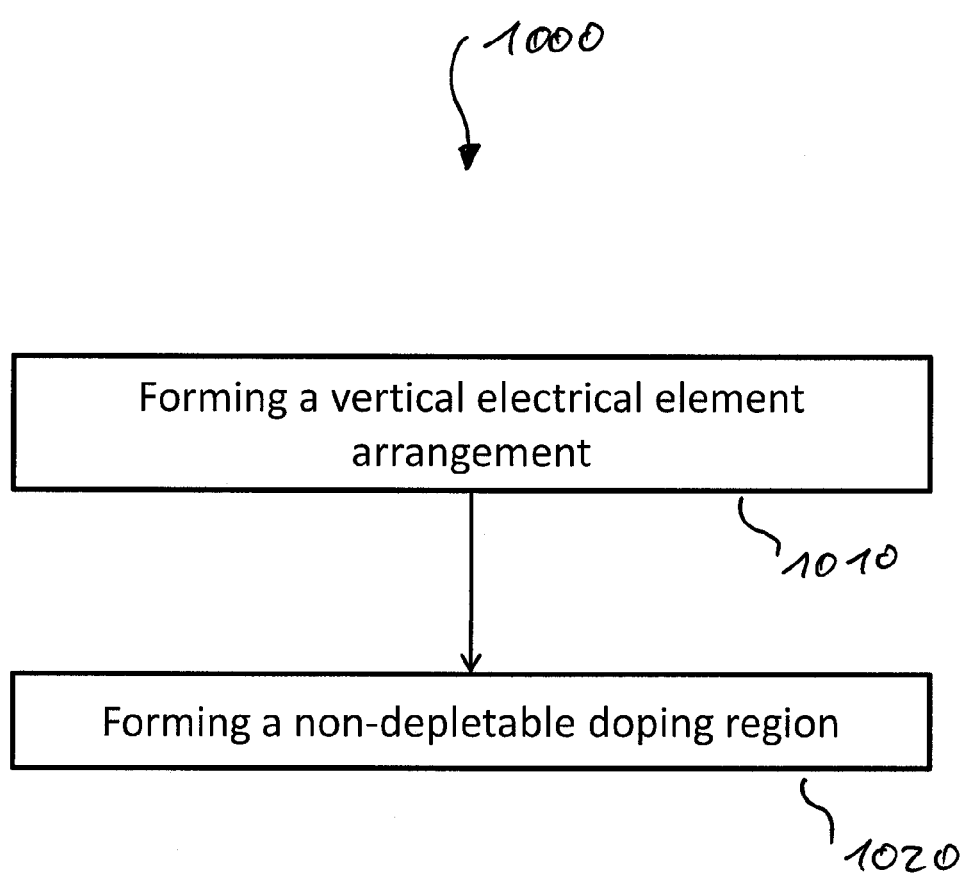
FIG. 9 shows a flow chart of a method for forming a semiconductor device.

FIG. 9 shows a flow chart of a method for forming a semiconductor device according to an embodiment. The method 1000 comprises forming 1010 a vertical electrical element arrangement enabling a current flow between a front side and a back side of a semiconductor substrate of the semiconductor device.

Further, the method 1000 comprises forming 1020 a non-depletable doping region extending laterally from an edge of a cell region of the semiconductor substrate towards an edge of the semiconductor substrate. The non-depletable doping region comprises a doping non-depletable by voltages applied to the semiconductor device during blocking operation. The non-depletable doping region comprises a first conductivity type. The non-depletable doping region comprises a maximal doping concentration at an area close to the cell region and a lower doping concentration of at least 10% of the maximal doping concentration of the non-depletable doping region at a lateral distance of more than 20 μm to a closest contact area between the semiconductor substrate and an electrically conductive contact structure of the vertical electrical element arrangement within the cell region, at a lateral distance of more than a depth of a drift zone or a compensation region of the plurality of compensation regions to a closest contact area between the semiconductor substrate and an electrically conductive contact structure of the vertical electrical element arrangement within the cell region or at a position located closer to an edge of the semiconductor substrate than a gate field plate implemented by a lowest electrically conductive layer. Further, a lateral distance between a part of the non-depletable doping region comprising the lower doping concentration and a doping region of the semiconductor substrate comprising the second conductivity type and located outside the cell region is lower than 20 μm.

The non-depletable doping region extending from the cell region into the edge region may promote the removal of the charge carriers through the contacts at the edge of the cell region. By implementing the non-depletable doping region, the load or stress at the edge of the cell region may be reduced. In this way, the reliability and/or durability of semiconductor device may be improved.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIGS. 1-8) or below.

Some embodiments relate to a commutating robust Cool-MOS™ with graded implant.

At super junction transistors with vertical columns, a majority of holes flows in the columns to the surface first and afterwards close to the surface towards the last cell so that up to an order of magnitude higher current densities or hole current densities occur (in comparison to a cell region hole current density). This may lead to increased charge carrier multiplication at regions of high surface field strength (e.g. below oxide steps or ramps) so that the dynamic breakdown voltage may be reduced and the device may be destroyed. The problem may be increased at chip corners or at the gate pad region, since the plasma flooded volume (per edge length) may be higher at that regions (increasing the current density or hole current density) and the electrical field may be increased due to additional curvature. Melted regions at destruction may be detected mainly at these positions.

For example, it is proposed to implement a highly doped, non-depletable, near-surface p-region (e.g. with decreasing doping towards outside) below the field oxide edge and/or the gate poly plate and optionally the gate pad, which may be implemented by an implant through several holes (within a mask layer). The holes may decrease at least partly towards the chip edge and/or the distances of the holes (between each other) may increase. The holes may form or may be strips, holes or grids.

For example, the maximal p-dose at the near-surface p-region (non-depletable doping region) within the silicon may be more than $2.5*10^{12}$ cm$^{-2}$ or more than $4*10^{12}$ cm$^{-2}$ or $7*10^{13}$ cm$^{-2}$. The implant dose may be more than $3*10^{12}$ cm$^{-2}$ or $6*10^{12}$ cm$^{-2}$ (e.g. a factor of 1 . . . 5 may be lost due to boron segregation effects). The cell may be implemented as trench cell as well, for example. The graded profile may be implemented in other ways as well (e.g. gray scale lithography and implant).

The near-surface, highly doped, graded p-region may be arranged geometrically at the whole circumference of the chip or at the critical regions only, at which a lot of plasma must be discharged (e.g. at the chip corners and/or around and/or below the gate pad), for example. The long sides may comprise no grading or another grading (e.g. smaller holes (of the implant mask) than at the outer chip corners).

For example, an application may be a half bridge or full bridge configuration with a super junction device with a proposed graded XU (with proposed non-depletable doping region).

For example, a proposed semiconductor device may be based on compensation structures. Such compensation devices may be n- or p-channel metal oxide semiconductor field-effect transistors, diodes, insulated gate bipolar transistors (IGBT), thyristors or other components. Compensation devices may be based on mutual compensation of a charge of n- and p-doped areas in the drift region of the transistor. The areas may be spatially arranged such that the line integral over the doping along a line running vertical to the p-n-junction remains below the material-specific breakdown charge (approximately $2\times10^{12}$ cm$^{-2}$ for lightly doped silicon). For example, in a vertical transistor, p- and n-pillars or plates may be arranged in pairs.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a plurality of compensation regions of a vertical electrical element arrangement, wherein the compensation regions of the plurality of compensation regions are arranged in a semiconductor substrate of the semiconductor device;
   a plurality of drift regions of the vertical electrical element arrangement arranged in the semiconductor substrate within a cell region of the semiconductor device, the plurality of drift regions and the plurality of compensation regions being arranged alternatingly in a lateral direction; and
   a non-depletable doping region extending laterally from an edge of the cell region towards an edge of the semiconductor substrate,
   wherein the non-depletable doping region comprises a doping non-depletable by voltages applied to the semiconductor device during a blocking operation,
   wherein the plurality of compensation regions and the non-depletable doping region comprise a first conductivity type and the plurality of drift regions comprise a second conductivity type,
   wherein the non-depletable doping region comprises a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a drift zone or a compensation region of the plurality of compensation regions to a closest contact area between the semiconductor substrate and the electrically conductive contact structure of the vertical electrical element arrangement within the cell region, or at a position located closer to an edge of the semiconductor substrate than a gate field plate implemented by a lowest electrically conductive layer.

2. The semiconductor device of claim 1, wherein the non-depletable doping region is located in the semiconductor substrate so that an ohmic path exists between the non-depletable doping region and the electrically conductive contact structure of the vertical electrical element arrangement within the cell region.

3. The semiconductor device of claim 1, wherein the non-depletable doping region extends laterally from a doping region of the vertical electrical element arrangement connected to the electrically conductive contact structure of the vertical electrical element arrangement towards an edge of the semiconductor device or extends laterally from the electrically conductive contact structure of the vertical electrical element arrangement within the cell region towards the edge of the semiconductor device.

4. The semiconductor device of claim 3, wherein the doping region of the vertical electrical element arrangement is an anode region, a cathode region, a drain region, a body region, a collector region, or a base region.

5. The semiconductor device of claim 1, wherein the non-depletable doping region comprises a thickness of less than 5 µm.

6. The semiconductor device of claim 1, wherein the non-depletable doping region extends into a larger depth of the semiconductor substrate than a body region of the vertical electrical element arrangement.

7. The semiconductor device of claim 1, wherein the non-depletable doping region is located adjacent to a surface of the semiconductor substrate.

8. The semiconductor device of claim 1, wherein the non-depletable doping region comprises a maximal doping concentration of more than $1*10^{16}$ cm$^{-3}$.

9. The semiconductor device of claim 1, wherein the non-depletable doping region comprises an incorporated doping dose of at least $2.5*10^{12}$ cm$^{-2}$.

10. The semiconductor device of claim 1, wherein a lateral profile of the doping concentration of the non-depletable doping region is on average decreasing from the area comprising the maximal doping concentration of the non-depletable doping region to an area comprising the lower doping concentration.

11. The semiconductor device of claim 1, wherein a lateral profile of the doping concentration of the non-depletable doping region comprises a plurality of local maxima and local minima between the area comprising the maximal doping concentration of the non-depletable doping region and an area comprising the lower doping concentration, wherein neighboring local maxima and local minima of the plurality of local maxima and local minima differ by more than 10% of the maximal doping concentration.

12. The semiconductor device of claim 1, wherein the non-depletable doping region laterally surrounds the cell region.

13. The semiconductor device of claim 12, wherein the non-depletable doping region comprises an average doping concentration at a corner region of the cell region being larger than an average doping concentration at an edge of the cell region extending substantially in parallel to an edge of the semiconductor substrate for more than 200 µm.

14. The semiconductor device of claim 1, further comprising:
a plurality of non-depletable doping regions located at corner regions of the cell region,
wherein the plurality of non-depletable doping regions are interrupted at edges of the cell region extending substantially in parallel to an edge of the semiconductor substrate for more than 200 µm.

15. The semiconductor device of claim 1, wherein the non-depletable doping region extends laterally below at least a part of a gate pad of the semiconductor device.

16. The semiconductor device of claim 1, further comprising:
a plurality of edge termination compensation regions of the first conductivity type located outside the cell region,
wherein the plurality of edge termination compensation regions is connected to the non-depletable doping region.

17. The semiconductor device of claim 1, wherein the vertical electrical element arrangement is a field effect transistor arrangement, and
wherein the non-depletable doping region is located at least at a part of the edge of the cell region arranged laterally farther away from a gate pad of the field effect transistor arrangement than 50% of the edge of the cell region.

18. A method for forming a semiconductor device, the method comprising:
forming a plurality of compensation regions of a vertical electrical element arrangement, the compensation regions of the plurality of compensation regions extending into a semiconductor substrate of the semiconductor device,
a plurality of drift regions of the vertical electrical element arrangement extending into the semiconductor substrate within a cell region of the semiconductor device, and
the plurality of drift regions and the plurality of compensation regions being arranged alternatingly in a lateral direction; and
forming a non-depletable doping region extending laterally from an edge of the cell region towards an edge of the semiconductor substrate, the non-depletable doping region comprising a doping non-depletable by voltages applied to the semiconductor device during a blocking operation,
the plurality of compensation regions and the non-depletable doping region comprising a first conductivity type and the plurality of drift regions comprises a second conductivity type, and
the non-depletable doping region comprising a maximal doping concentration at an area close to the cell region and a lower doping concentration of at least 10% of the maximal doping concentration of the non-depletable doping region at a lateral distance of more than 20 µm to a closest contact area between the semiconductor substrate and an electrically conductive contact structure of the vertical electrical element arrangement within the cell region, at a lateral distance of more than a depth of a drift zone or a compensation region of the plurality of compensation regions to a closest contact area between the semiconductor substrate and the electrically conductive contact structure of the vertical electrical element arrangement within the cell region, or at a position located closer to an edge of the semiconductor substrate than a gate field plate implemented by a lowest electrically conductive layer.

19. The method of claim 18, wherein forming the non-depletable doping region comprises forming an implant mask on the semiconductor substrate,
wherein the implant mask comprises holes with decreasing size or increasing distance to each other from an area planned to obtain the maximal doping concentration of the non-depletable doping region to an area planned to obtain the lower doping concentration.

\* \* \* \* \*